United States Patent
Jang

Patent Number: 5,946,269
Date of Patent: Aug. 31, 1999

[54] SYNCHRONOUS RAM CONTROLLING DEVICE AND METHOD

[75] Inventor: Tae-seong Jang, Kyungki-do, Rep. of Korea

[73] Assignee: Samsung Electronics, Co., Ltd., Suwon, Rep. of Korea

[21] Appl. No.: 09/156,345

[22] Filed: Sep. 18, 1998

[30] Foreign Application Priority Data

Sep. 29, 1997 [KR] Rep. of Korea ............ 97-49757

[51] Int. Cl.$^6$ .................................................. G11C 8/00
[52] U.S. Cl. ..................... 365/236; 365/233; 365/238.5
[58] Field of Search ............................... 365/236, 233, 365/238.5, 235

[56] References Cited

U.S. PATENT DOCUMENTS

5,390,149  2/1995  Vogley et al. ................ 189/365
5,726,950  3/1998  Okamoto et al. ............. 365/233

*Primary Examiner*—Huan Hoang
*Attorney, Agent, or Firm*—Marger Johnson & McCollom, P.C.

[57] ABSTRACT

There are provided a synchronous RAM controlling device and method for controlling a synchronous RAM in order to access data when a burst length of a memory access is full page regardless of whether a termination access method or a wrap-around access method is used. In the synchronous RAM controlling device, an OR gate performs an OR operation on a burst stop signal for stopping input/output of data in the synchronous RAM responsive to an externally received input/output operation command signal. A counter is reset in response to the OR-operation result and counts the cycles of an external system clock signal. A burst sensor senses completion of a burst operation according to a burst length signal which is externally received and represents a burst length of at least 1 and outputs the sensed result as the burst stop signal. A control signal is input to the burst sensor which causes the burst sensor to operate the memory in one of termination or wrap-around access methods. A controller outputs the control signal, where the value of the control signal indicates termination access method when a fuse of the controller is not cut and either no logic level or a high logic level are input to an input pad of the controller. When the fuse is cut or a logic low level is input to the input pad, then the control signal output by the controller will indicate wrap-around access method.

7 Claims, 8 Drawing Sheets

SYNCHRONOUS RAM CONTROLLING DEVICE AND METHOD

BACKGROUND OF THE INVENTION

1. Field of the Invention

The present invention relates to a random access memory (RAM), and more particularly, to a device and a method for controlling a synchronous RAM which operates in synchronization with a system clock signal.

2. Description of the Related Art

A synchronous dynamic RAM (SDRAM) can store a large amount of data in a relatively small circuit area and operates in synchronization with a system clock signal used in a central processing unit (CPU) of a computer, as disclosed in U.S. Pat. No. 5,390,149 "System Including a Data Processor, a Synchronous DRAM, a Peripheral Device, and a System Clock". The SRAM accesses data using the system clock signal, thus markedly reducing data access time as compared to a conventional general DRAM.

SDRAM operation under various conditions has not been standardized due to the recent emergence of the SDRAM. For example, if a burst length is a full page, data in the SDRAM can be accessed by two methods: the termination method and the wrap-around method. The termination method is the method used to access data when the burst length is 1, 2, 4, or 8. In the termination method, an output port of a synchronous RAM is terminated in a high impedance state after a full page of data has been accessed, when the burst length is a full page.

On the other hand, in the wrap-around method, after a full page of data has been accessed, data corresponding to an initial address of the page is accessed again. Here, the initial address is a column address externally input upon application of a data input/output command.

Most SDRAM manufacturing companies selectively use both methods. For example, synchronous graphics memory is a kind of SDRAM which usually employs the wrap-around method.

Therefore, a conventional SDRAM controlling device for controlling access to data in an SDRAM cannot support both methods because its hardware structure must be dedicated to only one of the methods. That is, the conventional SDRAM controlling device has the disadvantage that it cannot support both data access methods.

SUMMARY OF THE INVENTION

To solve the above problem, it is an object of the present invention to provide a synchronous RAM controlling device which allows data access by either a termination method or a wrap-around method when a burst length is a full page.

It is another object of the present invention to provide a synchronous RAM controlling method which allows data access by either a termination method or a wrap-around method when a burst length is a full page.

To achieve the above first object, there is provided a synchronous RAM controlling device for operating in synchronization with an external system clock signal, comprising:

OR means for performing an OR operation on a burst completion signal, for stopping input and/or output of data to and/or from the synchronous RAM, and an externally received input/output operation commanding signal;

counting means for counting the cycles of the external system clock signal, and which is reset in response to the OR-operation result;

burst sensing means for sensing the completion of a burst operation according to at least one externally received burst length signal, representing a burst length, and the count result of the counting means, in response to a control signal, and outputting the sensing result as the burst completion signal; and controlling means for generating the control signal according to whether data stored in the synchronous RAM is to be accessed by a termination method or by a wrap around method.

To achieve the second object, there is provided a synchronous RAM controlling method for controlling a synchronous RAM operated in synchronization with an external system clock signal, comprising the steps of:

(a) counting the cycles of the external system clock signal according to an input/output operation instruction;

(b) determining whether a burst length is a full page;

(c) generating a burst completion signal, for stopping the access of data of the synchronous RAM, according to the count value and the burst length, if the burst length is not a full page;

(d) determining whether the data is to be accessed by the termination method or by the wrap around method, if the burst length is a full page, and going to the step (c) if the data is to be accessed by the termination method;

(e) generating the burst completion signal according to a burst stop instruction if the data is to be accessed by the wrap-around method; and (f) after the step (c) or (e), stopping the access of the synchronous RAM, according to the burst stop signal.

A synchronous RAM controlled by the synchronous RAM controlling device of the present invention may be an SDRAM or a synchronous SRAM. A burst length and a column address strobe latency are terms related with operation of an SRAM. The burst length (BL) is the number of data units which can be successively read from or written to the synchronous RAM upon a single read or write operation command. That is, if the burst length is '4', 4 bits of data can be successively input/output via a data input/output pin upon a single input/output command. If the burst length is a full page, a full page of data can be successively input/output upon a single input/output command. Here, the full page is a total number of combinations of column addresses for accessing data in cells connected to selected word lines. That is, if a column address has N bits, the full page is $2^N$ bits. This burst length can be set by using a mode register set signal when a synchronous RAM is used.

In addition, the column address strobe latency (CL) is the number of cycles of a system clock from the point when a data read command is issued to the point when the data to be read first begins to be output.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Figures 1A, 1B:
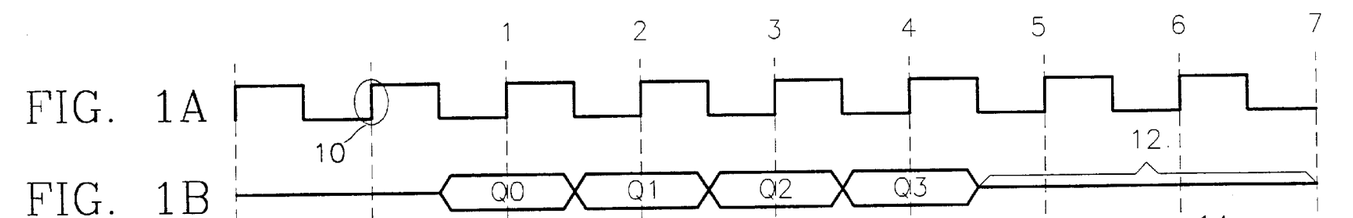
FIGS. 1A through 1D are timing diagrams referred to for describing the operation of a synchronous RAM.
Figures 1C, 1D:
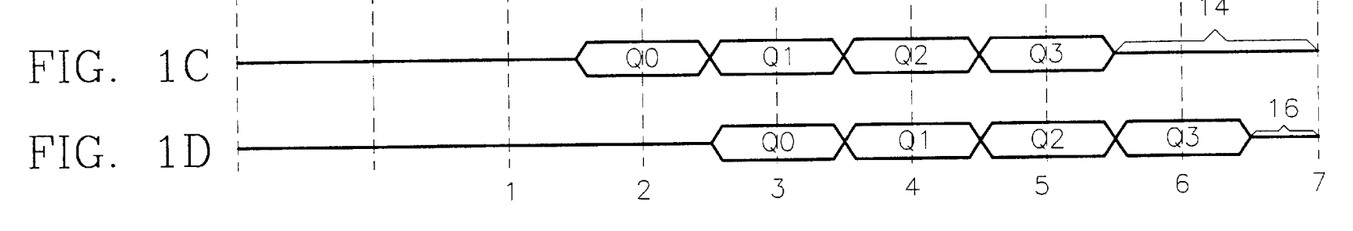

FIG. 1A illustrates the waveform of a system clock signal and FIGS. 1B and 1C illustrate the waveforms of data output from a synchronous RAM.

Assume that the burst length (BL) is 4 and that a data read command is applied to the RAM at a rising edge, indicated by the reference number 10 in FIG. 1A, of the system clock signal. Further assume that the column address strobe latency (CL) is 1, 2 and 3. Then four units of data Q0, 01, Q2 and Q3 can be output in response to the system clock signal, as shown in FIGS. 1B through 1D, from an output of the synchronous RAM within the first through the fourth cycles of the system clock signal. That is, assuming that the CL is 1, then four units of data Q0, Q1, Q2 and 03 are output, as shown in FIG. 1B, starting with the first cycle of the system clock signal, after a data read command is applied, indicated by reference number 1 shown in FIG. 1A. Likewise, if the CL is 2, then the four units of data 00, Q1, Q2 and Q3 are output, as shown in FIG. 1C, starting with the second cycle of the system clock signal, indicated by reference number 2 in FIG. 1A. When the CL is 3, then data is output starting at the third clock cycle 3 of the system clock signal, as shown in FIG. 1D.

After the burst of data is all output from the synchronous RAM, the output port of the synchronous RAM is set to a high impedance, as indicated by high impedance states 12, 14 and 16 illustrated in FIGS. 1B, 1C and 1D, respectively.

Figures 2A, 2B:
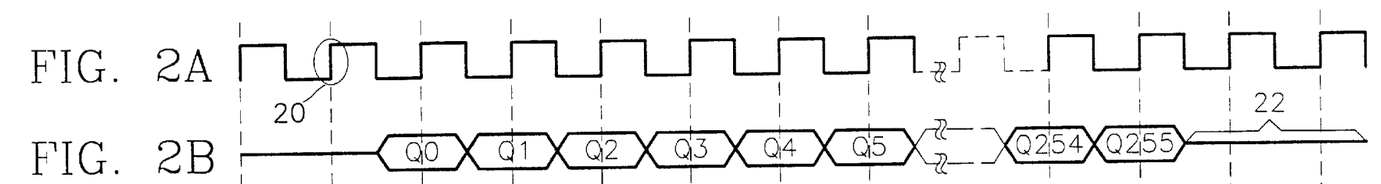
FIGS. 2A through 2C are waveform diagrams which are referred to for describing termination and wrap-around access methods.
Figure 2C:
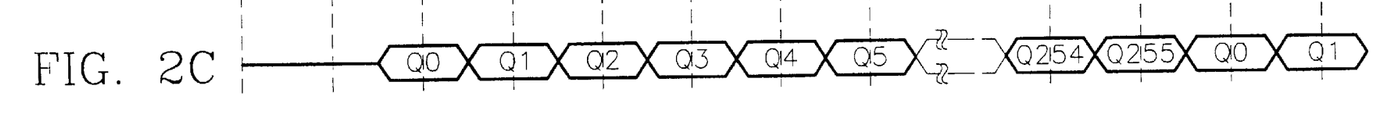

FIG. 2A also illustrates the waveform of a system clock signal and FIGS. 2B and 2C illustrate the waveforms for the output data from the synchronous RAM under the termination and wrap-around methods, respectively.

Assume that the BL is a full page of 256 words, the CL is 1, and the number N of column addresses is 8. In the termination data access method, upon application of a data read command at rising edge 20 of the system clock signal, shown FIG. 2B, a full page of 256 units of data Q0-0255 are sequentially output, as shown in FIG. 2B. The output port of the synchronous RAM is then set to a high impedance state 22.

On the other hand, in the wrap-around data access method, after the 256 units of data have all been output, as shown in FIG. 2C, then data continues to be output from the synchronous RAM, starting over again with the data Q0 corresponding to an initial address. To terminate the output of data from the synchronous RAM in this wrap-around method, an additional burst stop command is applied and the output port of the synchronous RAM is then set to a high impedance state.

The structure and operation of a synchronous RAM controlling device according to the present invention will be described by referring to the attached drawings.

Figure 3:
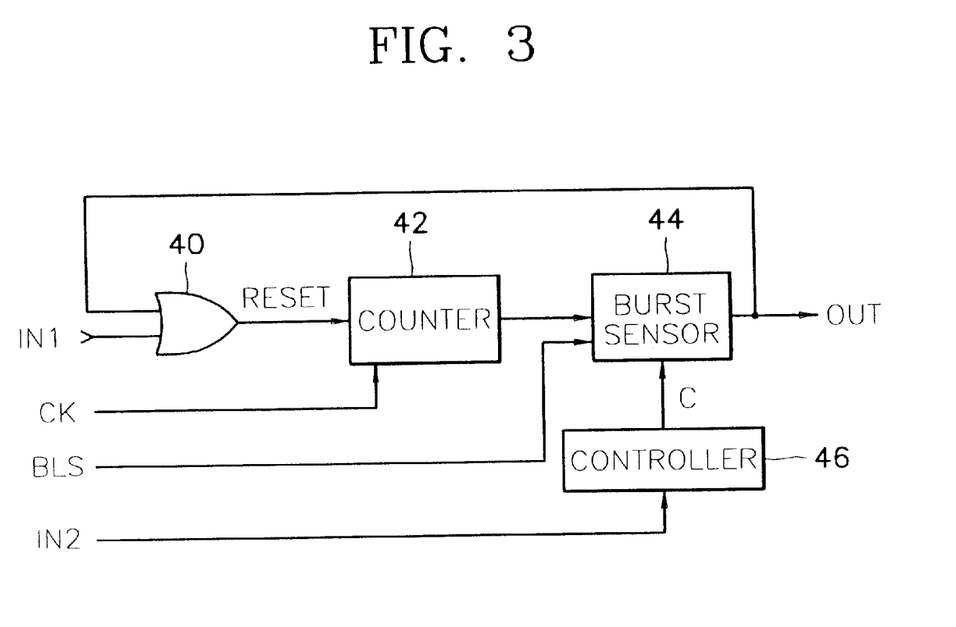
FIG. 3 is a block diagram of an embodiment of a synchronous RAM controlling device according to the present invention.

Referring now to FIG. 3, an embodiment of a synchronous RAM controlling device according to the present invention has an OR gate 40, a counter 42, a burst sensor 44, and a controller 46.

The OR gate 40 of FIG. 3 performs an OR operation on an input/output command signal, received via an input port IN1, and a burst completion signal received from the burst sensor 44, and outputs the OR operation result as a reset signal RESET to the counter 42. Here, the burst completion signal acts to stop the input/output of data to/from the synchronous RAM.

The counter 42 is reset by the reset signal RESET, counts a system clock signal CK with which the synchronous RAM is synchronized, and outputs the count result to the burst sensor 44.

The burst sensor 44 sense, in response to a control signal C, the completion of a burst operation according to at least one burst length signal BLS, which is externally input and represents a burst length (BL), and the count result received from the counter 42. The burst sensor 44 outputs the sensing result as the burst completion signal to the OR gate 40 and an output port OUT. Here, the burst operation means accessing an amount of data from the synchronous RAM determined according to the BL.

The controller 46 receives an external control signal via an input port IN2 which determines which method to employ for data access and outputs the control signal C corresponding to the received external control signal to the burst sensor 44. Here, when the BL is a full page and data is accessed by the wrap-around method, the number of bits of the count value of the counter 42 can be varied by the control signal C generated in the controller 46. This will be described below in greater detail.

The structure and operation of each portion in the synchronous RAM controlling device according to the present invention will be described referring to the attached drawings.

Figure 4:
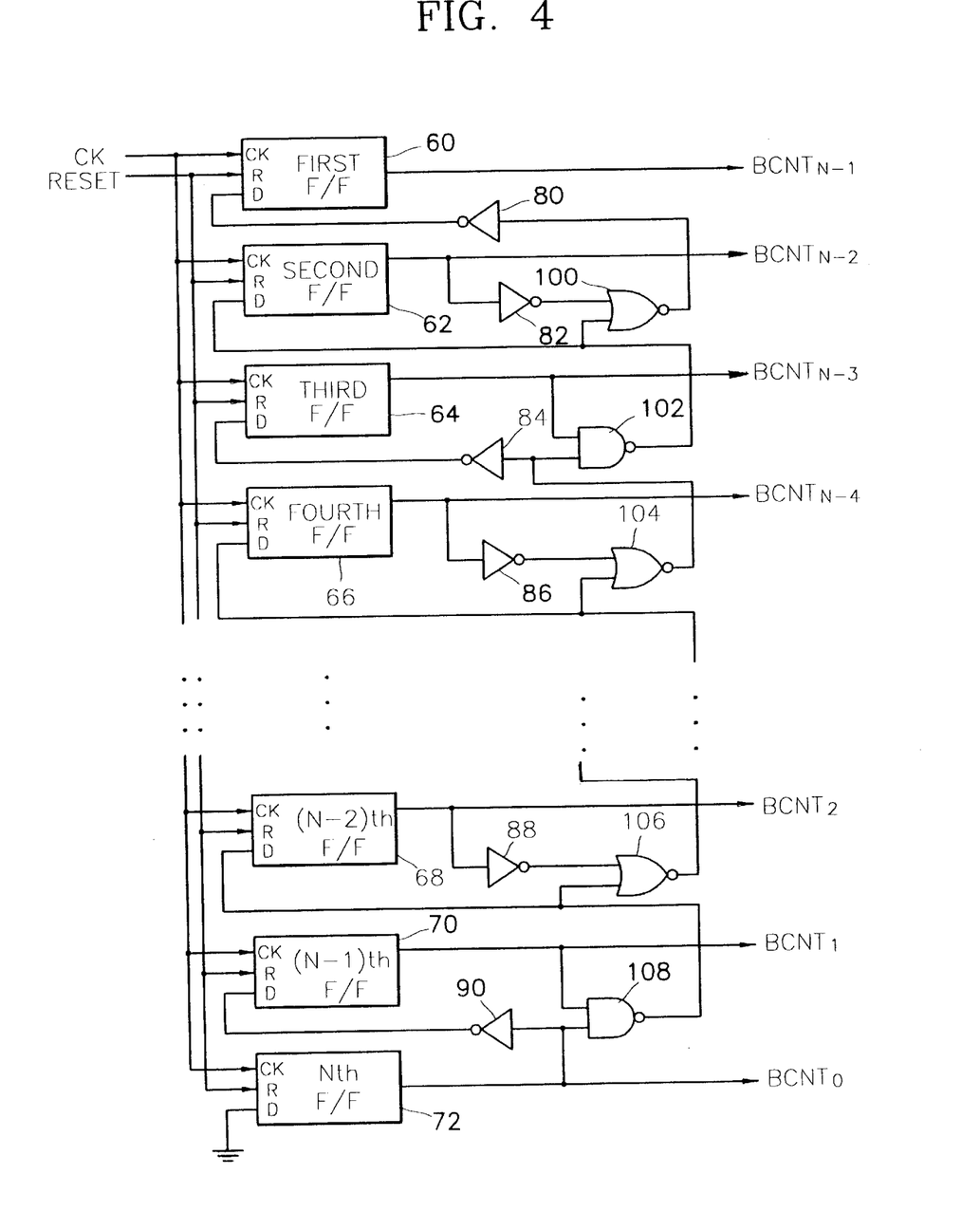
FIG. 4 is a circuit diagram of a preferred embodiment of the counter shown in FIG. 3 according to the present invention.

FIG. 4 is a circuit diagram of a preferred embodiment of the counter 42 shown in FIG. 3 according to the present invention. The counter 42 has first through Nth flip-flops (F/F) 60, 62, 64, 66, . . . , 68, 70 and 72, inverters 80, 82, 84, 86, . . . , 88 and 90, NOR gates 100, 104 and 106, and NAND gates 102, . . . , 108.

Each of the first, second, third, . . . , (N−1)th flip-flops 60, 62, 64, 66, . . . , 68, and 70 and the Nth flip-flop 72 shown in FIG. 4 is reset by the reset signal RESET received from the OR gate 40 shown in FIG. 3 via a reset port R. Each of the flip flops also outputs a signal that is output via output ports $BCNT_K (0 \leq K \leq N-1)$, which constitutes a count value which is output to burst sensor 44 shown in FIG. 3. The data signal output from each of the flip-flops is generally also received by a data input port D of the previous flip-flop in sequence such that the count value increments in response to the system clock signal CK received via a clock port CK of each flip-flop.

To obtain a counting function, the inverter 80 inverts the output of the NOR gate 100 and outputs the inverted output to the data input port D of the first flip-flop 60. Similarly, the inverter 90 inverts the output of the Nth flip-flop 72 and outputs the inverted output to the data input port D of the (N−1)th flip-flop 70. Here, the NOR gate 100 performs a NOR operation on the inverted output of the second flip-flop 62 and the output of the NAND gate 102 and outputs the NOR operation result to the inverter 80. In addition, the NAND gate 102 performs a NAND operation on the output of the NOR gate 104 and the output $BCNTN_{N-3}$ of the third flip-flop 64, and outputs the NAND operation result to the NOR gate 100 and the data input port D of the second flip-flop 62.

The NOR gate 104 performs a NOR operation on the output of the inverter 86 and the output of a NAND gate (not shown) of a previous counter stage and outputs the NOR operation result to the inverter 84 and the NAND gate 102. Similarly, the inverter 88, the NOR gate 106, and the (N−2)th and (N−1)th flip-flops 68 and 70 operate on the basis of the same principles.

Meanwhile, the Nth flip-flop 72 is reset by the reset signal RESET received from the OR gate 40 shown in FIG. 3 via a reset port R thereof. The Nth flip-flop 72 outputs a logic low level which is input via the data input port D thereof as $BCNT_0$ to the burst sensor 44 shown in FIG. 3 and is constructed so as to toggle in response to the system clock signal CK received via the clock port CK thereof.

Accordingly, the signal $BCNT_0$ is toggled in response to the system clock signal CK and has a period that is twice that of the system clock signal CK, and the signal $BCNT_k$ is toggled in response to $BCNT_{k-1}$ and has a period twice that of $BCNT_{k-1}$.

Each of the first, second, third, fourth, . . . , (N−2)th, (N−1)th and Nth flip-flops 60, 62, 64, 66, . . . , 68, 70 and 72, respectively, is reset by the reset signal RESET output from the OR gate 40, and is toggled in response to the output signal of the previous flip-flop. Therefore, some flip-flops do not always operate, i.e. change state, depending upon the value of BL. For example, assuming that data is accessed by the wrap-around method and the BL is 8, then only the (N−2)th through Nth flip-flops will operate, and the first through (N−3)th flip-flops are reset before operating. Thus, the flip-flops which do not operate consume less power, giving an overall power saving.

Figure 5:
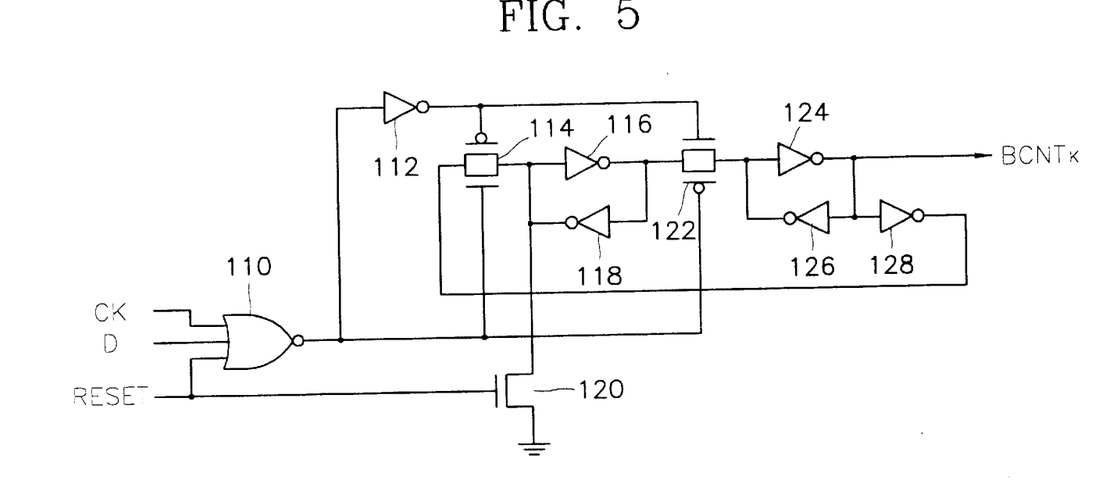
FIG. 5 is a circuit diagram of a preferred embodiment of each of the first through (N−1)th flip-flops shown in FIG. 4 according to the present invention.

Referring to FIG. 5, each of the first through (N−1)th flip-flops 60, 62, 64, . . . , and 66 is constructed from a NOR gate 110, inverters 112,116,118,124,126 and 128, transmission gates 114 and 122, and an NMOS transistor 120.

The NOR gate 110 shown in FIG. 5 performs a NOR operation on the system clock signal CK, data D received via the data input port, and the reset signal RESET, and outputs the NOR operation result to the inverter 112. The transmission gate 114 sends the output of the inverter 128 to the inverter 116 in response to the output of the inverter 112 and the output of the NOR gate 110. The transmission gate 122 sends the signal received from the inverter 116 to the inverter 124 in response to the inverted signal of the inverter 112 and the output of the NOR gate 110. Here, the NMOS transistor 120 resets the output signal $BCNT_k$ by turning on or off in response to the reset signal RESET.

Figure 6:
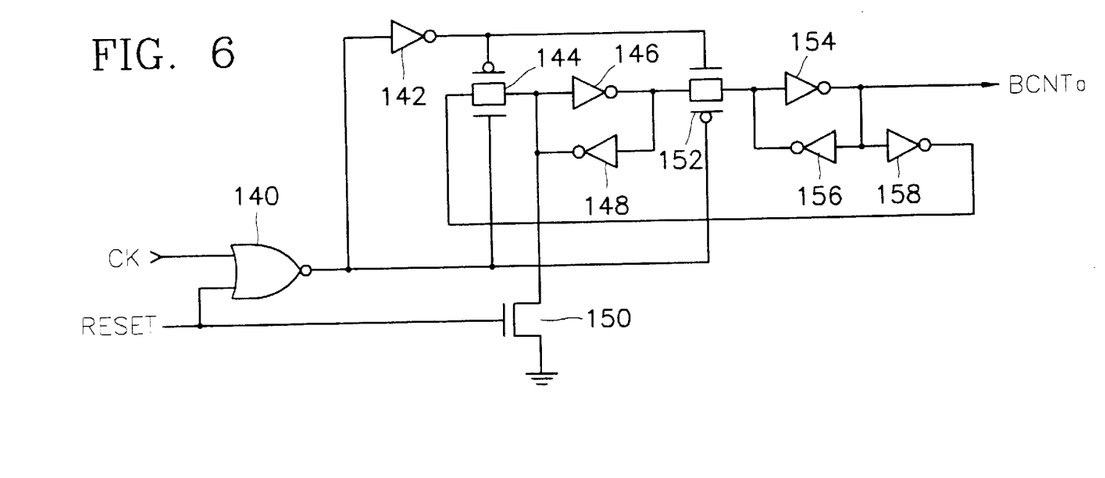
FIG. 6 is a circuit diagram of a preferred embodiment of the Nth flip-flop shown in FIG. 4 according to the present invention.

Referring to FIG. 6, the Nth flip-flop 68 includes a NOR gate 140, inverters 142,146,148,154,156 and 158, transmission gates 144 and 152, and an NMOS transistor 150.

The structure and operation of the circuit shown in FIG. 6 are the same as those of the circuit shown in FIG. 5 except that only the system clock signal CK and the reset signal RESET (and not the data D) are input to the NOR gate 140.

Thus, the value at output $BCNT_0$ toggles responsive to each clock cycle. The circuit shown in FIG. 6 outputs the least significant bit (LSB) $BCNT_0$ of the count value.

Figure 7:
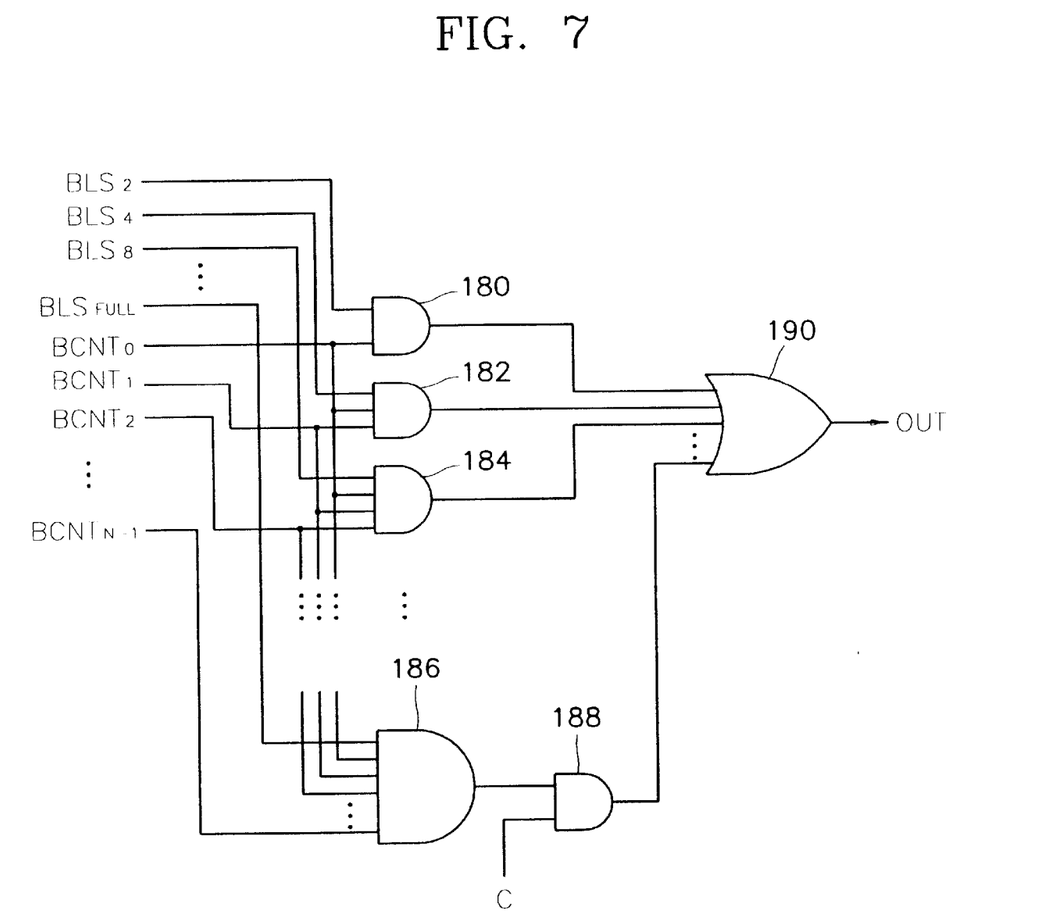
FIG. 7 is a circuit diagram of a preferred embodiment of the burst sensor shown in FIG. 3 according to the present invention.

FIG. 7 is a circuit diagram of a preferred embodiment of the burst sensor 44 shown in FIG. 3 according to the present invention. The burst sensor 44 has a plurality of AND gates 180, 182, 184, . . . , 186 and 188, and an OR gate 190.

The AND gate 180 shown in FIG. 7 performs an AND operation on a burst length signal $BLS_2$ (activated when BL=2) and the LSB $BCNT_0$ of the count value of the counter 42, and outputs the AND operation result to the OR gate 190. Similarly, the AND gate 182 performs an AND operation on a burst length signal $BLS_4$ (activated when BL=4) and the two LSBs $BCNT_0$ and $BCNT_1$ of the count value of the counter 42, and outputs the AND operation result to the OR gate 190. In the same way, the AND gate 184 performs an AND operation on a burst length signal $BLS_8$ (activated when BL=8) and the three LSBs $BCNT_0$, $BCNT_1$ and $BCNT_2$ of the count value of the counter 42, and outputs the AND operation result to the OR gate 190. Finally, the AND gate 186 performs an AND operation on a burst length signal $BLS_{FULL}$ (activated when the BL is a full page) and all N bits $BCNT_{N-1}$, $BCNT_{N-2}$, . . . , $BCNT_2$, $BCNT_1$ and $BCNT_0$ of the count value of the counter 42, and outputs the AND operation result to the OR gate 190. The AND gate 188 performs an AND operation on the output of the AND gate 186 and the control signal C, to selectively output the output of the AND gate 186 to the OR gate 190 according to the control signal C.

The OR gate 190 performs an OR operation on the outputs of the AND gates 180, 182, 184, . . . , and 188, and outputs the OR operation result as a burst completion signal via the output port OUT.

Figure 8A:
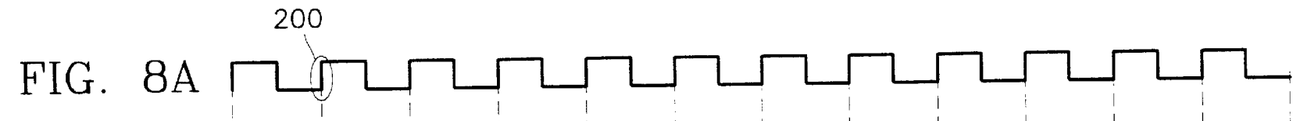
FIGS. 8A through 8H are waveform diagrams of signals which are referred to in describing the operation of the burst sensor shown in FIG. 7.

The operation of the burst sensor 44 shown in FIG. 7 will be described with reference to FIGS. 8A through 8H. FIG. 8A illustrates the waveform of the system clock signal, FIGS. 8B through 8G illustrate the waveforms of count values of the counter 42 shown in FIG. 4, and FIG. 8H illustrates the waveform of the burst completion signal.

The counter 42 shown in FIG. 3 counts the cycles of the system clock signal CK shown in FIG. 8A, and outputs the count values $BCNT_0$, $BCNT_1$, $BCNT_3$, $BCNT_4$, . . . and $BCNT_{N-1}$ shown in FIGS. 8B, 8C, 8D, 8E, 8F, . . . , and 8G, respectively, to the burst sensor 44. If the BL is 8, $BLS_2$, $BLS_4$, . . . , and $BLS_{FULL}$ are all at logic low levels except for $BLS_8$ which is at a logic high level. Thus, the outputs of the AND gates 180, 182, . . . , and 186 shown in FIG. 7 will remain at logic low levels, except for the output of the AND gate 184, upon which the output level of the OR gate 190 depends.

Figure 8B:
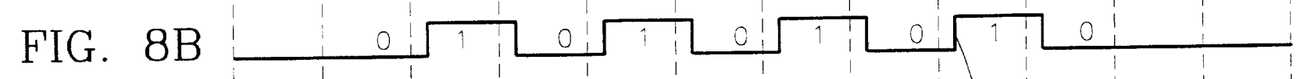
Figure 8C:
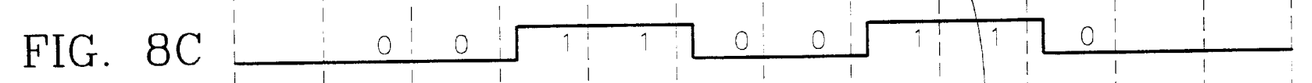
Figure 8D:
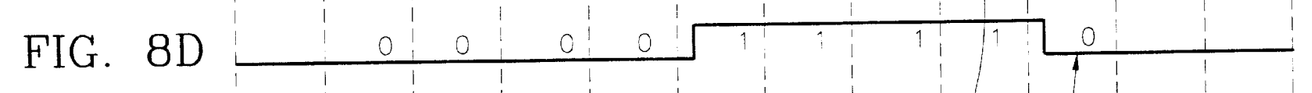
Figure 8E:
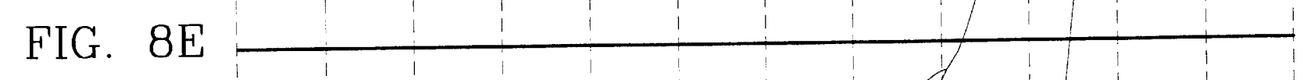
Figure 8F:
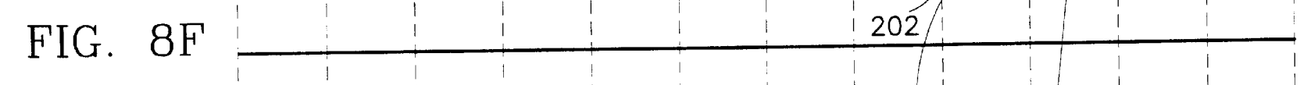
Figures 8G, 8H:
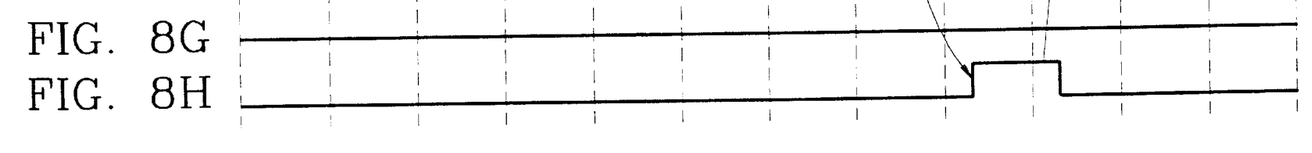

Here, if a data read command is input at a rising edge 200 of the system clock signal CK shown in FIG. 8A, then the count values, shown in FIGS. 8B through 8G, output from the counter 42 shown in FIG. 3 are reset to a logic low level. Then, the counter 42 begins counting the system clock signal CK and the three LSBs $BCNT_0$, $BCNT_1$ and $BCNT_2$ all reach logic high levels at a rising edge 202 after seven periods of the system clock signal CK. At that point, when the AND gate 184 performs an AND operation on logic high $BLS_8$ and logic high $BCNT_0$, $BCNT_1$ and $BCNT_2$ shown in FIGS. 8B, 8C and 8H, the output of the AND gate 184 causes the OR gate 190 to output the logic high burst completion signal shown in FIG. 8H. The synchronous RAM stops memory access in response to the logic high burst completion signal. Meanwhile, the counted values $BCNT_0$, $BCNT_1$ and $BCNT_2$ output from the counter 42 are again reset to a logic low level 204, as shown in FIGS. 8B, 8C and 8D, in response to the logic high burst completion signal shown in FIG. 8H.

If the burst length is set to a full page, then the signal $BLS_{FULL}$ is activated to a logic high level and the output of the AND gate 186 will obtain a logic high level only if the counted values $BCNT_{N-1}, \ldots, BCNT_4, BCNT_3, BCNT_2, BCNT_1$, and $BCNT_0$ are all at logic high levels. That is, after $2^{N-1}$ periods of the system clock signal CK, a logic high signal is output from the AND gate 186. Here, in the wrap-around method, a logic low control signal C is generated. Thus, the output of the AND gate 186 does not reach the OR gate 190 and the count value is allowed to rollover and access of data resumes at address 0.

In the termination method, a logic high control signal C is generated. Thus, the output of the AND gate 186 is output to the OR gate 190 and a logic high burst completion signal is output via the output port OUT which resets the counter 42 of FIG. 3 and the flip-flops of FIG. 4.

Figure 9:
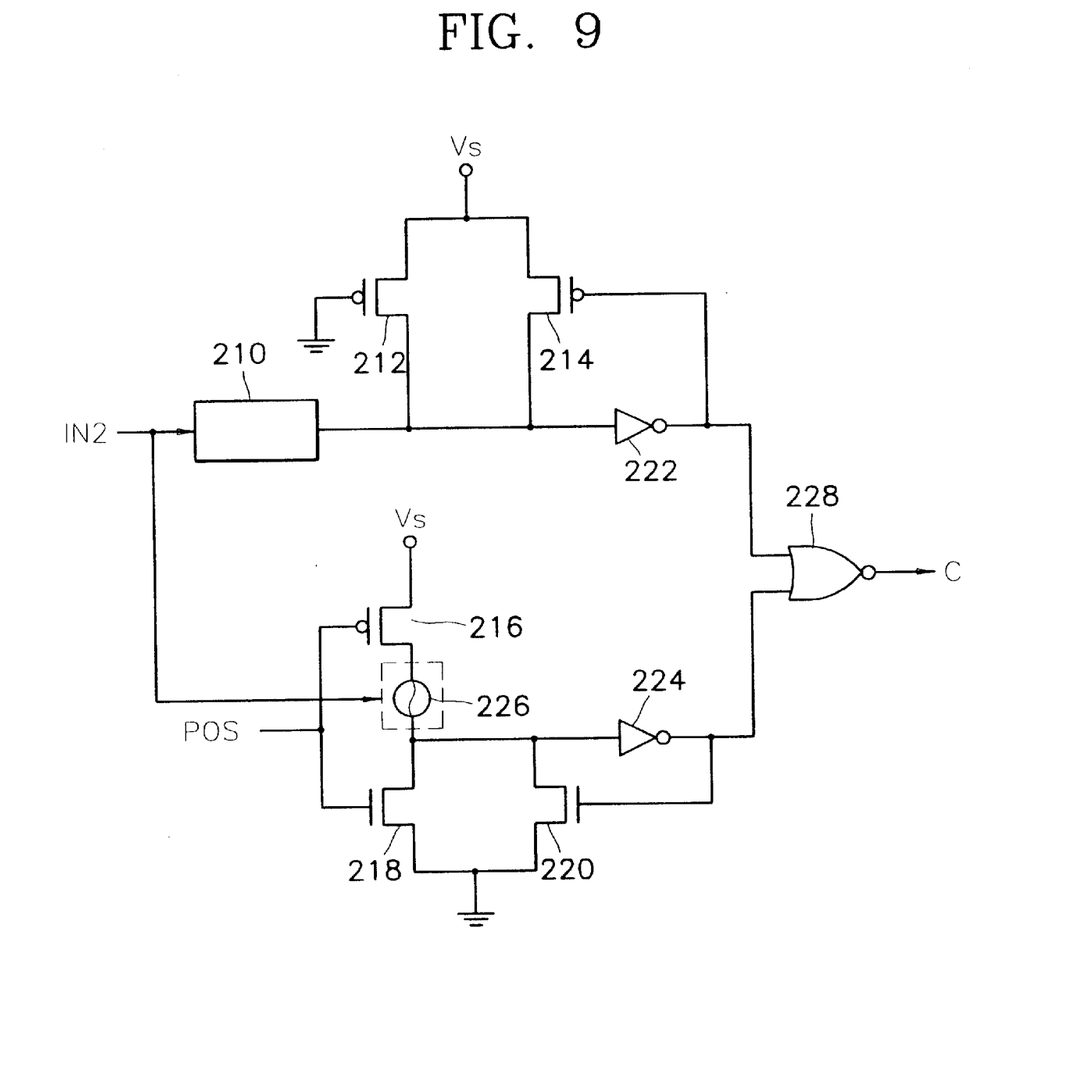
FIG. 9 is a circuit diagram of a preferred embodiment of the controller shown in FIG. 3 according to the present invention.

FIG. 9 is a circuit diagram of a preferred embodiment of the controller 46 shown in FIG. 3 according to the present invention. The controller 46 has a pad 210, PMOS transistors 212, 214 and 216, NMOS transistors 218 and 220, inverters 222 and 224, a fuse 226, and a NOR gate 228.

A wire can be bonded to the pad 210 and a desired voltage can be applied to the pad 210 through the input port IN2 as the external control signal. The PMOS transistor 212 has a grounded gate, and a source and a drain which are connected between a power supply source Vs and the pad 210. The input of the inverter 222 is connected to the pad 210. The PMOS transistor 214 has a source and a drain which are connected between the power supply source Vs and the pad 210, and a gate connected to the output of the inverter 222. The PMOS transistor 216 has a gate connected to a power-on-signal (POS) which changes from a logic high level to a logic low level once power supplied to the synchronous RAM has stabilized and a source and a drain which are connected between the power supply source Vs and the fuse 226. The NMOS transistor 218 has a gate connected to the POS and a drain and a source which are connected between the fuse 226 and the ground. The NMOS transistor 220 has a gate connected to the output of the inverter 224, and a drain and a source which are connected between the fuse 226 and the ground.

The NOR gate 228 performs a NOR operation on the output of the inverter 222 and the output of the inverter 224 and outputs the NOR operation result as the control signal C to the burst sensor 44. Here, the fuse 226 may be cut by laser or other methods such as voltage. That is, the fuse can be cut by a high voltage level which is input through the input port IN2 as the external control signal.

To operate the SDRAM controlling device in the wrap-around memory access method, the fuse 226 is cut or a logic low signal can be applied to the pad 210 as the external control signal. For the wrap-around method, if the fuse 226 is cut, then the inverter 224 outputs a logic high signal to the NOR gate 228 that is obtained by inverting the logic low signal received from the NMOS transistor 220. Thus, a logic low control signal C is generated. If a logic low signal is input as the external control signal through the pad 210 for the wrap-around method, then the inverter 222 outputs to the NOR gate 228 a logic high signal obtained by inverting the applied logic low signal. Thus, a logic low control signal C is generated. Here, when the logic low control signal C is input to the AND gate 188 in FIG. 7, then the output of the AND gate 186 cannot influence the burst completion signal output from the OR gate 190.

To operate the SDRAM controlling device in the termination access method, the fuse 226 is not cut and either a logic high signal is applied to the pad 210 or not signal at all is applied to the pad 210. Therefore, in the termination access method, the inverter 222 outputs a logic low signal obtained by inverting the logic high signal supplied from the PMOS transistor 212, and the inverter 224 outputs a logic low signal obtained by inverting the logic high signal supplied from the PMOS transistor 216. Thus, the NOR gate 228 outputs a logic high control signal C to the AND gate 188 shown in FIG. 7, thus enabling the output of the AND gate 186 to be input to the OR gate 190.

That is, with a burst length of a full page, data can be accessed in the termination access method. But if the pad 210 is wire-bonded to a logic low level or the fuse 226 is cut, then data will be accessed in the wrap-around method.

A synchronous RAM controlling method of the present invention will now be described referring to FIG. 10.

The controlling method involves step (240) for counting an external system clock signal cycles, steps (242)–(248) for generating a burst stop command according to a burst length and a data access method, and step (250) of controlling data access according to the burst stop command.

Figure 10:
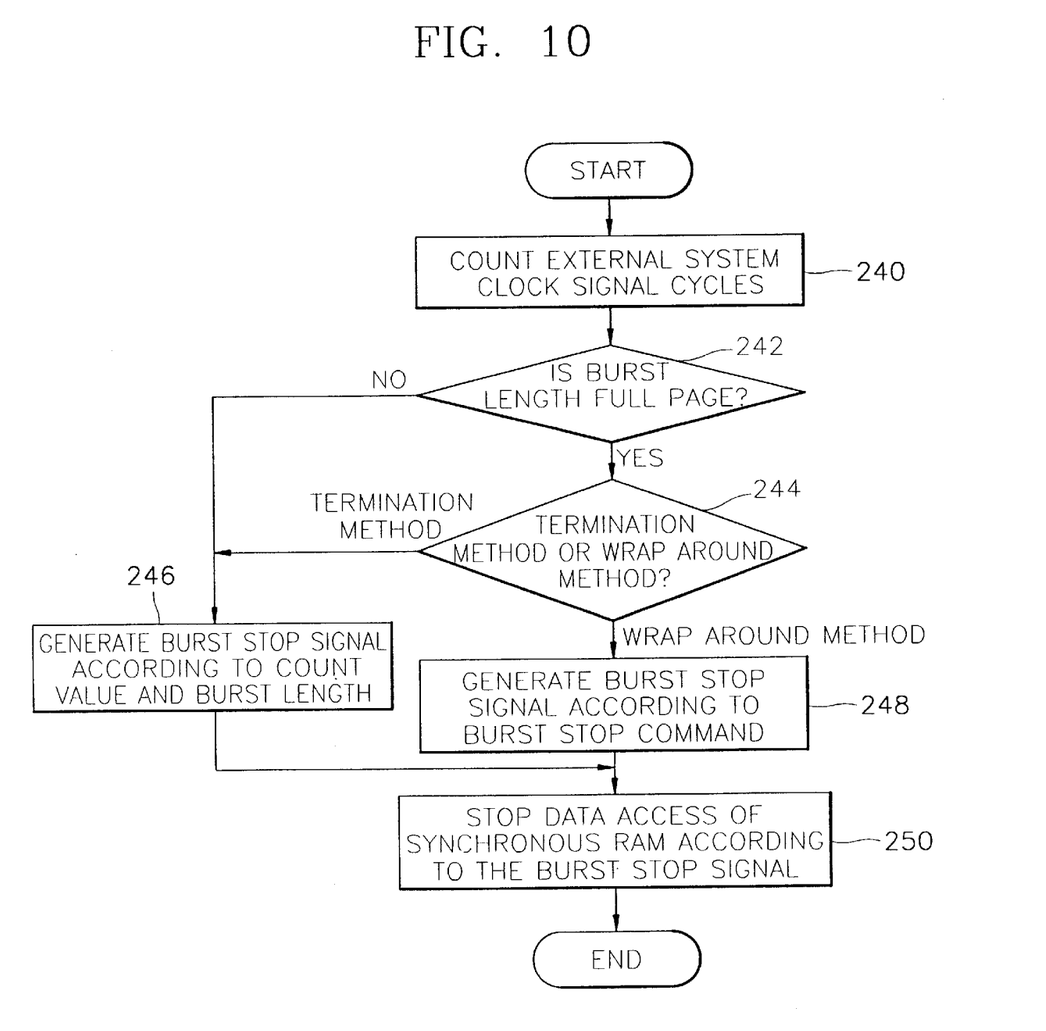
FIG. 10 is a flowchart of a synchronous RAM controlling method according to the present invention.

Referring to FIG. 10, the cycles of the external system clock signal with which the synchronous RAM is synchronized are counted in step (240). In step (242), it is determined whether the burst length is a full page. If the burst length is not a full page, but is 1, 2, 4, or 8, etc., then control branches to step (246) wherein a burst completion signal for stopping access to the synchronous RAM is generated according to the count value and the burst length.

Otherwise, if the burst length is a full page, then control branches at step (242) to step (244) where it is determined whether the memory is accessed by the termination method or by the wrap-around method. If the memory is accessed by the termination method, then the procedure goes to step (246) and a burst completion signal is generated according to the count value and the burst length. However, when memory is accessed by the wrap-around method, then a burst completion signal is generated according to a burst stop command in step (248).

After step (248) or (246), the access of data of the synchronous RAM stops according to the burst stop signal (250).

As described above, the synchronous RAM controlling device and method of the present invention provide for control of memory access regardless of whether the termination access method or the wrap-around access method is used. Also, the present invention reduces power consumption through the manner in which it controls the counter.

While the present invention has been illustrated and described with reference to specific embodiments, further modifications and alterations within the spirit and scope of this invention will occur to those skilled in the art.

What is claimed is:

1. A synchronous RAM controlling device for operating in synchronization with an external system clock signal, comprising:

OR means for performing an OR operation on a burst stop signal, for stopping input and/or output of data to and/or from the synchronous RAM, and an externally received input/output operation commanding signal;

counting means for counting the cycles of the external system clock signal, and which is reset in response to the OR operation result;

burst sensing means for sensing the completion of a burst operation according to at least one externally received burst length signal, representing a burst length, and the count result of the counting means, in response to a control signal, and outputting the sensing result as the burst stop signal; and controlling means for generating the control signal according to whether data stored in the synchronous RAM is to be accessed by a termination method or by a wrap around method.

2. The synchronous RAM controlling device as claimed in claim 1, wherein the controlling means comprises:

a first MOS transistor having a gate connected to a power-on-signal generated upon stable application of power to the synchronous RAM, and a source and a drain connected between a power source and a first node;

a fuse connected between the first node and a second node, which is cut according to the memory access method;

a second MOS transistor having a gate connected to the power-on-signal and a drain and a source connected between the second node and a reference potential;

a third MOS transistor having a drain and a source which are connected between the second node and the reference potential; and a first inverter which inverts the voltage of the second node and outputs the inverted voltage to the gate of the third MOS transistor and, as the control signal, to the burst sensing means.

3. The synchronous RAM controlling device as claimed in claim 1, wherein the controlling means comprises:

a pad for receiving a voltage which indicates whether data stored in the synchronous RAM is to be accessed by the termination method or the wrap around method, and outputting the received voltage to a third node;

a fourth MOS transistor having a gate connected to a reference potential, and a drain and a source connected between the third node and the power source;

a fifth MOS transistor having a drain and a source connected between the third node and the power source; and a second inverter which inverts the voltage of the third node and outputs the inverted voltage to the gate of the fifth MOS transistor, and, as the control signal, to the burst sensing means.

4. The synchronous RAM controlling device as claimed in claim 2, wherein the controlling means further comprises:

a pad for receiving a voltage which indicates whether data stored in the synchronous RAM is to be accessed by the termination method or the wrap around method, and outputting the received voltage to a third node;

a fourth MOS transistor having a gate connected to a reference potential, and a drain and a source connected between the third node and the power source;

a fifth MOS transistor having a drain and a source connected between the third node and the power source;

a second inverter which inverts the voltage of the third node and outputs the inverted voltage to the gate of the fifth MOS transistor; and a NOR gate for performing a NOR operation on the output of the first inverter and the output of the second inverter and outputting the NOR operation result as the control signal to the burst sensing means.

5. A synchronous RAM controlling method for controlling a synchronous RAM operated in synchronization with an external system clock signal, comprising the steps of:

(a) counting the cycles of the external system clock signal according to an input/output operation command;

(b) determining whether a burst length is a full page;

(c) generating a burst stop signal, for stopping the access of data of the synchronous RAM, according to the count value and the burst length, if the burst length is not a full page;

(d) determining whether the data is to be accessed by the termination method or by the wrap around method, if the burst length is a full page, and going to the step (c) if the data is to be accessed by the termination method; and (e) generating the burst stop signal according to a burst stop command if the data is to be accessed by the wrap around method; and (f) after the step (c) or (e), stopping the access of the synchronous RAM, according to the burst stop signal.

6. A memory controller for operating a synchronous memory device in either a termination mode or a wrap-around mode, the memory controller comprising:

a counter having clock input, reset input and count output terminals, where the counter is configured to count cycles of a system clock signal received at the clock input and output a corresponding count value at the count output terminal, and where the counter is further configured to reset the count value responsive to a reset signal received at the reset terminal;

an input gate having first and second input terminals and an output terminal, where the output terminal is coupled to the reset terminal of the counter and where the input gate is configured to logically combine an external command signal received at the first input terminal and a burst stop signal received at the second input terminal in order to generate the reset signal at the output terminal;

an access mode control circuit having an input terminal and an output terminal configured to output an access mode control signal, the access mode control circuit including a fuse, where the access mode control circuit is configured to generate a termination state of the access mode control signal when the fuse is uncut and either a high logic level or no logic level is input to the input terminal of the access mode control circuit, and where the access mode control circuit is configured to generate a wrap-around state of the access mode control signal when the fuse is cut or a low logic level is input to the input terminal of the access mode control circuit; and a burst sensor circuit having a count input terminal coupled to the count output terminal of the counter, a burst length terminal configured to receive a burst length signal, a control input coupled to the output terminal of the access mode control circuit and an output terminal coupled to the second input terminal of the input gate, where, responsive to when the count value corresponds to a full page value of the burst length signal, the burst sensor circuit is configured to generate the burst stop signal at the output terminal when the access mode control signal is in the termination state and suppress the burst stop signal when the access mode control signal is in the wrap-around state.

7. The memory controller of claim 6, wherein the access mode control circuit further comprises:

a first PMOS transistor having a source coupled to a power supply terminal, a drain coupled to a first terminal of the fuse, and a gate terminal configured to receive a POS signal;

a first NMOS transistor having a source coupled to a ground terminal, a drain coupled to a second terminal of the fuse, and a gate terminal configured to receive the POS signal;

a second NMOS transistor having a source coupled to the ground terminal, a drain coupled to the drain of the first NMOS transistor and a gate terminal;

a first inverter having an input coupled to the drain of the second NMOS transistor and an output coupled to the gate of the second NMOS transistor;

a second PMOS transistor having a source coupled to the power supply terminal, a gate coupled to the ground terminal and a drain;

an input pad coupled between the input terminal of the access mode control circuit and the drain of the second PMOS transistor;

a third PMOS transistor having a source coupled to the power supply terminal, a drain coupled to the drain of the second PMOS transistor and a gate;

a second inverter having an input coupled to the drain of the second PMOS transistor and an output coupled to the gate of the third PMOS transistor; and a logic gate having a first input coupled to the output of the first inverter, a second input coupled to the output of the second inverter, and an output coupled to the output terminal of the access mode control circuit.

* * * * *

UNITED STATES PATENT AND TRADEMARK OFFICE
CERTIFICATE OF CORRECTION

PATENT NO.   : 5,946,269
DATED        : August 31, 1999
INVENTOR(S)  : Jang

It is certified that error appears in the above-identified patent and that said Letters Patent is hereby corrected as shown below:

Column 3,
Line 33, "01" should read -- Q1 --.
Line 38, "03" should read -- Q3 --.
Line 42, "00" should read -- Q0 --.
Line 60, "0255" should read -- Q255 --.

Column 5,
Line 9, "BCNTNN-3" should read -- BCNTN-3 --.

Signed and Sealed this

Tenth Day of December, 2002

JAMES E. ROGAN
*Director of the United States Patent and Trademark Office*